(12) United States Patent
Kim

(10) Patent No.: US 11,443,695 B2
(45) Date of Patent: Sep. 13, 2022

(54) DISPLAY APPARATUS

(71) Applicant: SAMSUNG DISPLAY CO., LTD., Yongin-si (KR)

(72) Inventor: Byungsun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/271,172

(22) Filed: Feb. 8, 2019

(65) Prior Publication Data
US 2019/0279575 A1 Sep. 12, 2019

(30) Foreign Application Priority Data
Mar. 9, 2018 (KR) .......................... 10-2018-0028292

(51) Int. Cl.
*G09G 3/3266* (2016.01)
*G09G 3/3225* (2016.01)

(52) U.S. Cl.
CPC ......... *G09G 3/3266* (2013.01); *G09G 3/3225* (2013.01); *G09G 2300/0426* (2013.01); *G09G 2310/0281* (2013.01)

(58) Field of Classification Search
CPC ......... G09G 3/3266; G09G 2300/0426; G09G 2310/0281
See application file for complete search history.

(56) References Cited

U.S. PATENT DOCUMENTS

| | | | |
|---|---|---|---|
| 8,040,302 B2 | 10/2011 | Shin | |
| 2005/0264496 A1* | 12/2005 | Shin | G09G 3/3233 345/76 |
| 2010/0141570 A1* | 6/2010 | Horiuchi | G09G 3/3611 345/100 |
| 2012/0050234 A1* | 3/2012 | Jang | G09G 3/3225 345/204 |
| 2012/0147000 A1* | 6/2012 | Song | H04N 13/341 345/419 |
| 2014/0211117 A1* | 7/2014 | Choi | H01L 27/124 349/43 |
| 2016/0189659 A1* | 6/2016 | Park | G09G 3/3696 345/87 |
| 2017/0033166 A1 | 2/2017 | Shim | |
| 2017/0170248 A1* | 6/2017 | Sato | H01L 27/3276 |
| 2017/0206826 A1 | 7/2017 | Kong | |

(Continued)

FOREIGN PATENT DOCUMENTS

| | | |
|---|---|---|
| KR | 10-2005-0113683 | 12/2005 |
| KR | 10-2006-0011259 | 2/2006 |

(Continued)

*Primary Examiner* — William Boddie
*Assistant Examiner* — Bipin Gyawali
(74) *Attorney, Agent, or Firm* — Kile Park Reed & Houtteman PLLC

(57) ABSTRACT

A display apparatus includes a substrate having a display area and a peripheral area, the peripheral area being outside the display area, a display unit on the display area of the substrate, the display unit including a pixel circuit and a display device electrically connected to the pixel circuit, a driver in the peripheral area of the substrate and configured to provide a signal to the display device, and an output wiring configured to transmit the signal from the driver to the display device, at least a part of the output wiring overlapping the driver.

27 Claims, 5 Drawing Sheets

(56) References Cited

U.S. PATENT DOCUMENTS

| | | | |
|---|---|---|---|
| 2017/0249905 A1 | 8/2017 | Kim | |
| 2018/0308871 A1* | 10/2018 | Wu | G11C 19/28 |
| 2018/0357973 A1* | 12/2018 | Um | G09G 3/20 |
| 2019/0129552 A1* | 5/2019 | Lee | H01L 51/5203 |
| 2019/0179467 A1* | 6/2019 | Kim | H01L 27/323 |
| 2019/0196619 A1* | 6/2019 | Baek | G06F 3/04166 |

FOREIGN PATENT DOCUMENTS

| | | |
|---|---|---|
| KR | 10-2009-0061387 | 6/2009 |
| KR | 10-2016-0082883 | 7/2016 |
| KR | 10-2017-0015637 | 2/2017 |
| KR | 10-2017-0087079 | 7/2017 |
| KR | 10-2017-0102146 | 9/2017 |

\* cited by examiner

DISPLAY APPARATUS

CROSS-REFERENCE TO RELATED APPLICATION

Korean Patent Application No. 10-2018-0028292, filed on Mar. 9, 2018, in the Korean Intellectual Property Office, and entitled: "Display Apparatus," is incorporated by reference herein in its entirety.

BACKGROUND

1. Field

Embodiments relate to a display apparatus.

2. Description of the Related Art

Among display apparatuses, an organic light-emitting display apparatus is expected to become a next generation display apparatus due to its wide viewing angles, high contrast, and quick response time.

Generally, the organic light-emitting display apparatus operates when thin-film transistors and organic light-emitting devices are arranged on a substrate and the organic light-emitting devices emit light. Each of the organic light-emitting devices may operate as a pixel of the organic light-emitting display apparatus. The organic light-emitting display apparatus is used as a display in a small-sized product such as a mobile phone, etc., as well as a display in a large-sized product such as a television, etc.

SUMMARY

Embodiments are directed to a display apparatus, including a substrate having a display area and a peripheral area, the peripheral area being outside the display area; a display unit on the display area of the substrate, the display unit including a pixel circuit and a display device electrically connected to the pixel circuit; a driver in the peripheral area of the substrate and configured to provide a signal to the display device; and an output wiring configured to transmit the signal from the driver to the display device, at least a part of the output wiring overlapping the driver.

The driver may include a scan driver, the scan driver being in the peripheral area of the substrate and in a neighboring area outside the display unit, the scan driver being configured to provide a scan signal for driving the display device, and the output wiring may include a scan line, the scan line being configured to transmit the scan signal output from the scan driver to the display device.

The scan line may overlap the scan driver to pass over an upper surface of the scan driver, such that the scan driver is interposed between the scan line and the substrate.

The driver may include a light emission control driver in the peripheral area of the substrate and in a neighboring area outside the scan driver, the light emission control driver being configured to provide a light emission control signal for driving the display device.

The scan line may not overlap the light emission control driver.

The scan driver may be between the light emission control driver and the display unit.

The display unit may have a curved edge in at least a part of an area of the display unit.

The display unit may have at least one round-shaped edge.

The driver may be located in the peripheral area adjacent to the part of the area of the display unit, and may be bent along the curved edge of the area of the display unit.

The pixel circuit may include a thin-film transistor including a semiconductor layer and a gate electrode of which at least a part overlaps the semiconductor layer, a first conductive layer above the thin-film transistor, and a second conductive layer above the first conductive layer, and the driver may include a driving semiconductor layer on a same layer as that of the semiconductor layer, a driving gate electrode on a same layer as that of the gate electrode, and a third conductive layer on a same layer as that of the first conductive layer.

The output wiring may be on a same layer as that of the second conductive layer.

The output wiring may be electrically connected to the third conductive layer.

The display device may include a pixel electrode, a common electrode above the pixel electrode, and an organic light emission layer between the pixel electrode and the common electrode.

The display apparatus may further include a power supply wiring in the peripheral area of the substrate and in a neighboring area outside the driver, and electrically connected to the common electrode of the display device.

Embodiments are also directed to a display apparatus, including a substrate having a display area and a peripheral area, the peripheral area being outside the display area; a display unit on the display area of the substrate, the display unit including a pixel circuit and a display device electrically connected to the pixel circuit; a first driver in the peripheral area of the substrate and on a side of the display unit, the first driver being configured to provide a scan signal to the display device; a second driver in the peripheral area of the substrate and on a side of the display, the second driver being configured to provide a light emission control signal to the display device; and a first wiring configured to transmit the scan signal from the first driver to the display device, at least a part of the first wiring overlapping the first driver.

The first driver may be between the second driver and the display unit.

The display unit may have at least one round-shaped edge.

At least of a part of the first driver and at least a part of the second driver may be bent along a curve outside the at least one round-shaped edge.

The pixel circuit may include a thin-film transistor including a semiconductor layer and a gate electrode of which at least a part overlaps the semiconductor layer, a first conductive layer over the pixel circuit, and a second conductive layer over the first conductive layer, and the first wiring may be on a same layer as that of the second conductive layer.

The display apparatus may further include a power supply wiring in the peripheral area and in a neighboring area outside at least one of the first driver and the second driver, the power supply wiring being configured to supply power to the display device.

BRIEF DESCRIPTION OF THE DRAWINGS

Features will become apparent to those of skill in the art by describing in detail example embodiments with reference to the attached drawings in which.

DETAILED DESCRIPTION

Figure 1:
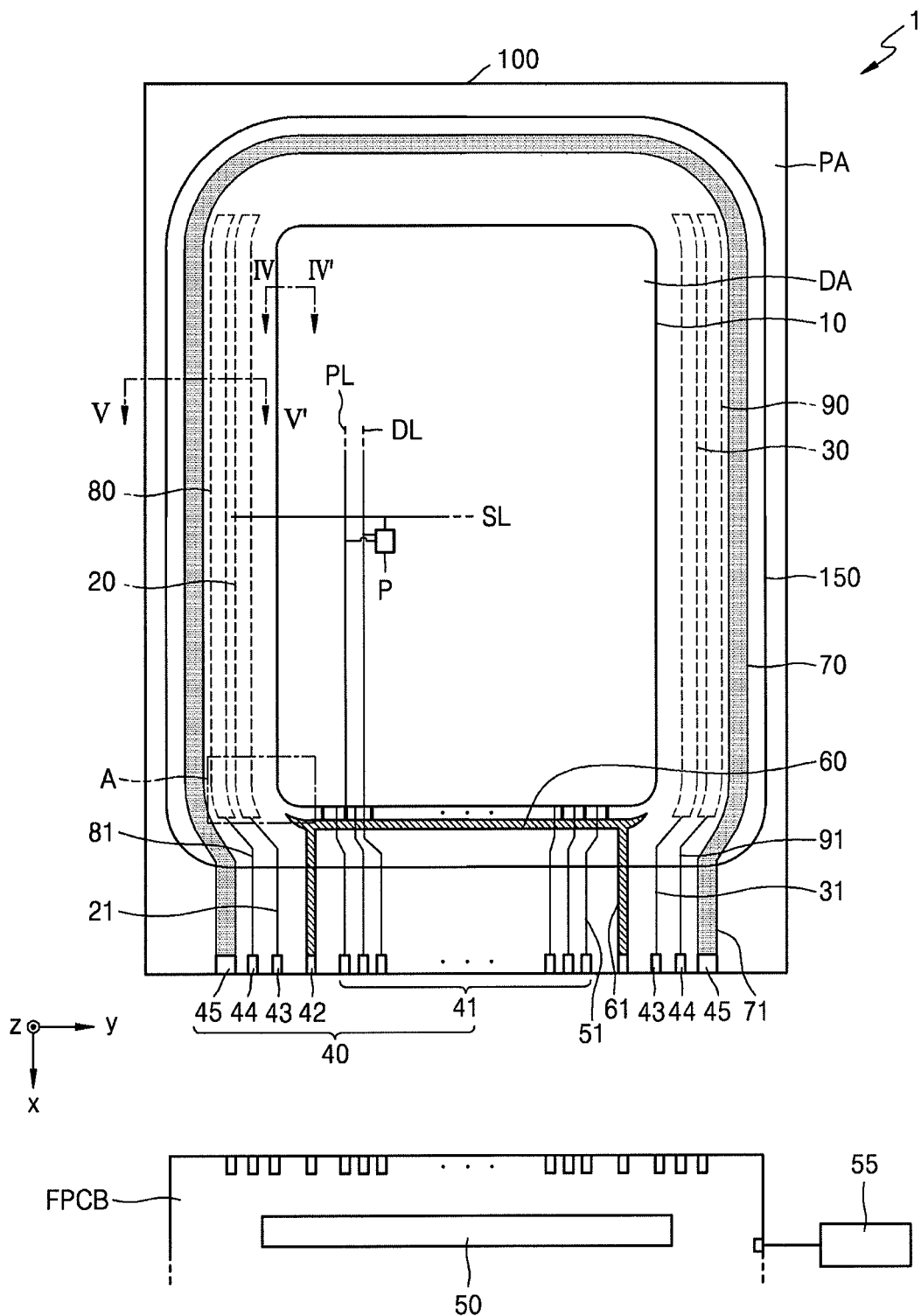
FIG. 1 illustrates a schematic plan view of a display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. Thus, for example, intervening layers, regions, or components may be present.

Sizes of elements in the drawings may be exaggerated for convenience of explanation. Thus, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to" or "coupled to" another layer, region, or component, it may be "directly connected or coupled" to the other layer, region, or component, or "indirectly connected to" the other layer, region, or component with intervening layers, regions, or components therebetween. For example, it will be understood that when a layer, region, or component is referred to as being electrically "connected to" or "coupled to" another layer, region, or component, it may be "directly electrically connected or coupled" to the other layer, region, or component, or "indirectly electrically connected to" the other layer, region, or component with intervening layer, region, or component therebetween.

A display apparatus is a device configured to display an image, and may be a liquid crystal display, an electrophoretic display, an organic light-emitting display, an inorganic light-emitting display, a field emission display, a surface-conduction electron-emitter display, a plasma display, a cathode ray display, or the like.

Hereinafter, an organic light-emitting display is described as an example but the display apparatus may be various types of a display apparatus.

Figure 2:
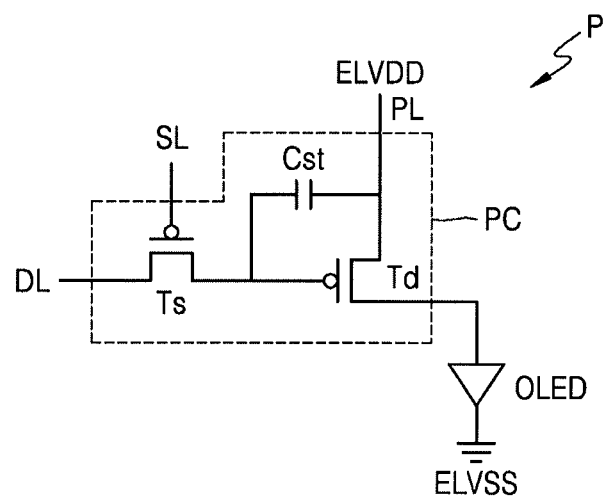
FIG. 2 illustrates an equivalent circuit diagram of a pixel in the display apparatus according to an example embodiment.

FIG. 1 illustrates a schematic plan view of a display apparatus 1 according to an example embodiment. FIG. 2 illustrates an equivalent circuit diagram of a pixel P in the display apparatus 1 according to an example embodiment.

Referring to FIG. 1, the display apparatus 1 includes a display unit 10 arranged on a substrate 100. The display unit 10 includes pixels P connected to a scan line SL extending in a first direction, e.g., a y-direction, and a data line DL extending in a second direction, e.g., an x-direction crossing the y-direction. The display unit 10 provides a certain image through light emitted from the pixels P and defines a display area DA.

The display unit 10 may have a curved edge in at least a part of an area thereof. In the present example embodiment, the display unit 10 may approximately have a quadrilateral shape and may have one or more round edges.

Each pixel P may emit, for example, red, green, blue, or white light. Each pixel P may include a display device 200 (shown in FIG. 4). The display device 200 may include an organic light-emitting diode. In this specification, the pixel P represents a pixel P emitting one of red, green, blue, and white light as described above.

Referring to FIG. 2, the pixel P may include a pixel circuit PC connected to the scan line SL and the data line DL, and an organic light-emitting diode OLED connected to the pixel circuit PC. The pixel circuit PC includes a driving thin-film transistor Td, a switching thin-film transistor Ts, and a storage capacitor Cst. The switching thin-film transistor Ts is connected to the scan line SL and the data line DL. If a data signal is input via the data line DL, the switching thin-film transistor Ts may transmit the data signal to the driving thin-film transistor Td according to a scan signal input via the scan line SL.

The storage capacitor Cst is connected to the switching thin-film transistor Ts and a driving voltage line PL. The storage capacitor Cst stores a voltage corresponding to a difference between a voltage transmitted from the switching thin-film transistor Ts and a driving voltage ELVDD supplied to the driving voltage line PL.

The driving thin-film transistor Td is connected to the driving voltage line PL and the storage capacitor Cst. The driving thin-film transistor Td may control driving current flowing from the driving voltage line PL to the organic light-emitting diode OLED in correspondence with a value of the voltage stored in the storage capacitor Cst. The organic light-emitting diode OLED may emit light having certain brightness according to the driving current. For example, the organic light-emitting device OLED may, for example, emit red, green, blue, or white light.

FIG. 2 illustrates a case when the pixel P includes two thin-film transistors and a storage thin-film transistor but the pixel circuit PC in the pixel P may be modified variously to include, for example, three or more thin-film transistors or two or more storage thin-film transistors.

Referring back to FIG. 1, a peripheral area PA is arranged outside the display area DA. For example, the peripheral area PA may surround the display area DA. The peripheral area PA is an area where the pixels P are not arranged and corresponds to a non-display area that does not provide an image.

In the peripheral area PA, a drive circuit, for example, a first scan driver 20, a second scan driver 30, a first light emission control driver 80, and a second first light emission control driver 90, a terminal unit 40, a driving power supply wiring 60, and a common power supply wiring 70 may be arranged.

The first and second scan drivers 20 and 30 are arranged in the peripheral area PA of the substrate 100, and generate and transmit a scan signal to each pixel P via the scan line SL. As an example, the first scan driver 20 may be arranged to the left of the display unit 10, and the second scan driver 30 may be arranged to the right of the display unit 10 but, for example, only one scan driver may be present.

In the present example embodiment, the first and second light emission control drivers 80 and 90 are arranged in the peripheral area PA of the substrate 100 and generate and transmit a light emission signal to each pixel P via a light emission control line. As an example, the first light emission control driver 80 may be arranged to the left of the display unit 10, and the second light emission control driver 90 may be arranged to the right of the display unit 10. In an implementation, one light emission control driver may be present.

The terminal unit 40 is arranged at an end of the substrate 100, and includes a plurality of terminals 41, 42, 43, 44, and 45. The terminal unit 40 may not be covered by an insulating layer and may be exposed to be electrically connected to a flexible printed circuit board FPCB. The terminal unit 40 may be arranged at a side of the substrate 100 in which the first and second scan drivers 20 and 30 are not arranged.

The flexible printed circuit board FPCB may electrically connect a controller 55 to the terminal unit 40. A signal or power transmitted from the controller 55 may be provided via connection wirings 21, 31, 51, 61, 71, 81, and 91 connected to the terminal unit 40.

The controller 55 may receive a vertical synchronization signal, a horizontal synchronization signal, and a clock signal, and generate a control signal for controlling driving of the first and second scan drivers 20 and 30. The generated control signal may be transmitted to each of the first and second scan drivers 20 and 30 via the terminal 43 connected to the flexible printed circuit board FPCB and the connection wirings 21 and 31. A scan signal generated from the first and second scan drivers 20 and 30 may be provided to each pixel P via the scan line SL.

In addition, the controller 55 may generate a control signal for controlling driving of the first and second light emission control drivers 80 and 90. The generated control signal may be transmitted to each of the first and second light emission control drivers 80 and 90 via the terminal 44 connected to the flexible printed circuit board FPCB and the connection wirings 81 and 91. A light emission control signal generated from the first and second light emission control drivers 80 and 90 may be provided to each pixel P via the light emission control line.

The controller 55 may provide the driving voltage ELVDD and common power ELVSS to each of the driving power supply wiring 60 and the common power supply wiring 70 via the terminals 42 and 45 connected to the flexible printed circuit FPCB and the connection wirings 61 and 71. The driving voltage ELVDD may be provided to each pixel P via the driving voltage line PL. The common power ELVSS may be provided to a common electrode of the pixel P.

A data driving circuit 50 may be arranged on the flexible printed circuit board FPCB. The data driving circuit 50 may provide a data signal to each pixel P. A data signal provided by the data driving circuit 50 may be provided to each pixel P via the connection wiring 51 connected to the terminal 41 and the data line DL connected to the connection wiring 51. FIG. 1 illustrates that the data driving circuit 50 is arranged on the flexible printed circuit board FPCB but, for example, the data driving circuit 50 may be arranged in the peripheral area PA of the substrate 100.

The driving power supply wiring 60 may be arranged in the peripheral area PA. For example, the driving power supply wiring 60 may be arranged between a side of the display unit 10, adjacent to the terminal unit 40, and the terminal unit 40. The driving voltage ELVDD provided via the connection wiring 61 connected to the terminal 41 may be provided to each pixel P via the driving voltage line PL.

The common power supply wiring 70 may be arranged in the peripheral area PA and surround a part of the display unit 10. For example, the common power supply wiring 70 may have a loop form that is open at a side of the display unit 10 adjacent to the terminal unit 40, while extending, for example, continuously, along an edge of the substrate 100 other than where it is open at the terminal unit 40. The common power supply wiring 70 may be electrically connected to the connection wiring 71 connected to the terminal 45, and may provide the common power ELVSS to a common electrode (for example, a cathode) of the organic light-emitting diode OLED included in the pixel P.

Figure 3:
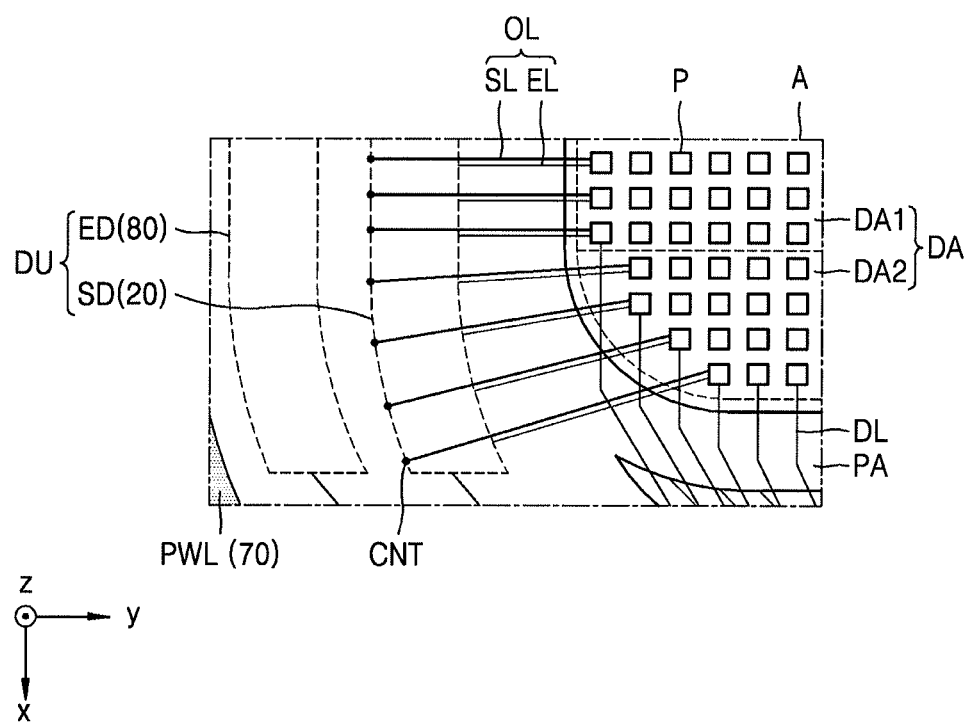
FIG. 3 illustrates a schematic plan view of a part A of FIG. 1.

FIG. 3 is a schematic plan view illustrating a part A of FIG. 1.

FIG. 3 illustrates a relation of connection of the pixels P and an output wiring OL to a driver DU. The part A shown in FIG. 1 represents a part of a lower portion of the display unit DA and a part of a lower portion of the peripheral area PA.

For convenience of description of a relation of connection between respective wirings, FIG. 3 shows one of scan lines connected to a pixel P and a light emission control line as an example, and the scan line and the light emission control line are respectively denoted as a "scan line SL" and a "light emission control line EL". In addition, only some of data lines are shown. The data lines are denoted as the "data lines DL". Power supply lines are not shown for convenience of description. Although some output wirings are shown here, scan lines, light emission control lines, data lines, power supply lines, a first initialization power supply line and a second initialization power supply line may be additionally provided.

Referring to FIG. 3, the display area DA may include a first display area DA1 and a second display area DA2. The pixels P may be arranged to form rows and columns in the first display area DA1 and the second display area DA2. The pixels P include a plurality of rows of the pixels P arranged in the first direction (a y-axis direction). Each row of the pixels P may be arranged to extend in the second direction (an x-axis direction) to be parallel with the first direction (the y-axis direction). The pixels P include a plurality of columns of the pixels P arranged in the second direction (the x-axis direction). Each column of the pixels P may be arranged to extend in the first direction (the y-axis direction) to be parallel with the second direction (the x-axis direction). Thus, the pixels P may be arranged in a certain matrix form.

The first display area DA1 of the display area DA has a rectangular form and includes a same number of pixels P in each row of the pixels P (the y-axis). The second display area DA2 of the display area DA includes a round shape, and a number of pixels P in the second display DA2 vary depending on rows (the y-axis). Thus, when the second display area DA2 is viewed in the second direction (the x-axis direction), that is, when the second display DA2 is viewed from a position away from the first display area DA1, a number of the pixels P in the rows (the y-axis) may decrease. Accordingly, in the second display area DA2, the number of the pixels P provided in each row of the pixels P may vary (although some rows may have a same number of pixels P in the second display area DA2). In the second display area DA2, in a case of a row of the pixels P adjacent to the first display area DA1, the row may include more pixels P than a row that is not adjacent to the first display area DA1.

For convenience of description, a side of the display area DA is shown. However, other sides of the display area DA may be formed by using a substantially same method so that the display area DA has a bilaterally symmetrical form. Here, lengths of rows of the pixels P in each area of the pixels P decrease when the rows are viewed in the second direction (the x-axis direction). However, lengths of rows may not decrease at a same rate in each row (or numbers of the pixels P in the respective rows may not decrease at a same rate). In the second display area DA2, a number of the pixels P in each row of the pixels P may vary.

The driver DU is arranged in the peripheral area PA, and the output wiring OL may connect the pixels P to the driver DU.

The driver DU includes a scan driver SD connected to the pixels P via the scan lines SL. The scan driver SD may be provided to be adjacent to a neighboring area outside the display area DA.

The scan driver SD may include a plurality of scan stages. Each of the scan stages may be connected to one of the scan lines SL. The scan lines SL connect output terminals of the scan stages to a scan signal input terminal of an outermost pixel P in a row of the pixels P. The scan stages may be driven in correspondence with a clock signal. The scan stages may be implemented as circuits substantially identical to each other.

The scan driver SD may have a shape corresponding to shapes of the first display area DA1 and the second display area DA2. Thus, an area of the scan driver SD corresponding to the second display area DA2 may have a round shape. The scan driver SD may extend along an edge of the display area DA.

The scan lines SL included in the display area DA and the peripheral area PA may be parallel with the first direction (the y-axis direction) or tilted with respect to the first direction (the y-axis direction). The peripheral area PA may surround the display area DA. Thus, an area of the peripheral area PA corresponding to the second display area DA2 may have a round shape along an edge of the second display area DA2.

Additionally, the driver DU includes a light emission control driver ED connected to the pixels P. The light emission control driver ED may be adjacent to the scan driver SD. Thus, the scan driver SD may be arranged between the light emission control driver ED and the display area DA. Accordingly, the light emission control driver ED may be arranged in an outer area further away from the display area DA compared to that of the scan driver SD.

The light emission control driver ED may include a plurality of light emission stages. The light emission control lines EL connect output terminals of the light emission stages to a light emission signal input terminal of an outermost pixel P in a row of the pixels P. The light emission stages may be driven in correspondence with a clock signal. The light emission stages may be implemented as circuits substantially identical to each other.

The light emission control driver ED may have a shape corresponding to a shape of the first display area DA1 and the second display area DA2. Thus, an area of the light emission control driver ED adjacent to the second display area DA2 may have a round shape.

The light emission control lines EL included in the peripheral area PA may be parallel with the first direction (the y-axis direction) or tilted with respect to the first direction (the y-axis direction). Ends of the light emission control lines EL included in the peripheral area PA are respectively connected to the pixels P and the other ends thereof are respectively connected to the light emission stages.

An area of the light emission control driver ED corresponding to the second display area DA2 may have a round shape. Thus, the light emission stages corresponding to the second display area DA2 may be arranged along a curved portion of the peripheral area PA.

For convenience of description, FIG. 3 illustrates that the scan lines SL are connected to the outermost pixel P in each row of the pixels P. However, the scan lines SL may be connected to any pixel P included in each row of the pixels. The light emission control lines EL may also be connected to any pixel P included in each row of the pixels.

The flexible printed circuit board FPCB may include a data driving circuit 50 (shown in FIG. 1). Each row of the pixels P may be connected to a data line DL corresponding thereto. The data lines DL are connected to the data driving circuit 50. For convenience of description, FIG. 3 illustrates that the data lines DL are connected to the outermost pixel P in each row of the pixels P. However, the data lines DL may be respectively connected to all the pixels P included in each row of the pixels, and the pixels P in a same row may share same data lines.

The data lines DL may extend in the second direction (the x-axis direction) in the display area DA. The data lines DL may extend generally in the second direction (the x-axis direction) in the peripheral area PA. However, the data lines DL may be bent in an area and extend in a direction tilted with respect to the second direction (the x-axis direction). The data lines DL may extend to converge in a direction toward the data driving circuit 50, and constitute a data line pan out unit to have a form spreading toward the direction from the data driving circuit 50 to the pixels P.

As described above, sides of the scan lines SL are electrically connected to the pixels P and the other sides of the scan lines SL are electrically connected to the scan driver SD. Thus, the scan lines SL may transmit a scan signal output from the scan driver SD to the pixels P. In the present example embodiment, at least a part of the scan lines SL may overlap the scan driver SD. Thus, the scan lines SL may be arranged to pass over an upper part of the scan driver SD and come into contact CNT with the other end of the scan driver SD.

With reference to the scan driver SD, the display unit 10 may be arranged at a side of the scan driver SD, and the light emission control driver ED may be arranged at the other side thereof. The scan lines SL may be arranged to pass over the upper part of the scan driver SD and come in contact CNT with the other side of the scan driver SD, that is, a portion adjacent to the light emission control driver ED. The scan lines SL may be arranged not to overlap the light emission control driver ED.

A visible display area of an image may be implemented to have a maximum size by reducing a non-light emission area, that is, a dead space (DS). The DS is defined as a peripheral area PA near the display area DA. A dummy pixel portion DPX, the data lines D, the driver DU, and a power supply line PWL may be arranged in the peripheral area PA. In this case, according to an example embodiment, if the display unit 10 is formed to have at least one round-shaped edge (that is, the second display area DA2 shown in FIG. 3), an area in which the data lines DL overlap the output wiring OL connected to the driver DU is present. Thus, a peripheral area, that is, the DS may have to be expanded to ensure a space in which the output wiring OL is to be arranged.

According to an example embodiment, the display apparatus is configured such that the output wiring OL connected to the driver DU comes in contact not with a side of the driver DU (that is, a portion adjacent to the display unit 10) but with the other side of the driver DU (that is, with a portion adjacent to an edge of the substrate 100). In the present example embodiment, the scan line SL connected to the scan driver SD comes in the contact CNT not with a side of the scan driver SD (that is, a portion adjacent to the display unit 10) but with the other side of the scan driver SD (that is, with a portion adjacent to the light emission control driver ED). The scan line SL overlaps an upper part of the scan driver SD, and may pass over the upper part of the scan driver SD and electrically come in the contact CNT with the scan driver SD at the other side of the scan driver SD. As a position in which the scan driver SD comes in the contact CNT with the scan line SL moves from a side of the scan driver SD to the other side of the scan driver SD, an area of the upper part of the scan driver DL may be ensured as a space in which the scan line SL is to be designed. Thus, a display apparatus in which a DS is reduced may be implemented without having to increase the DS.

Figure 4:
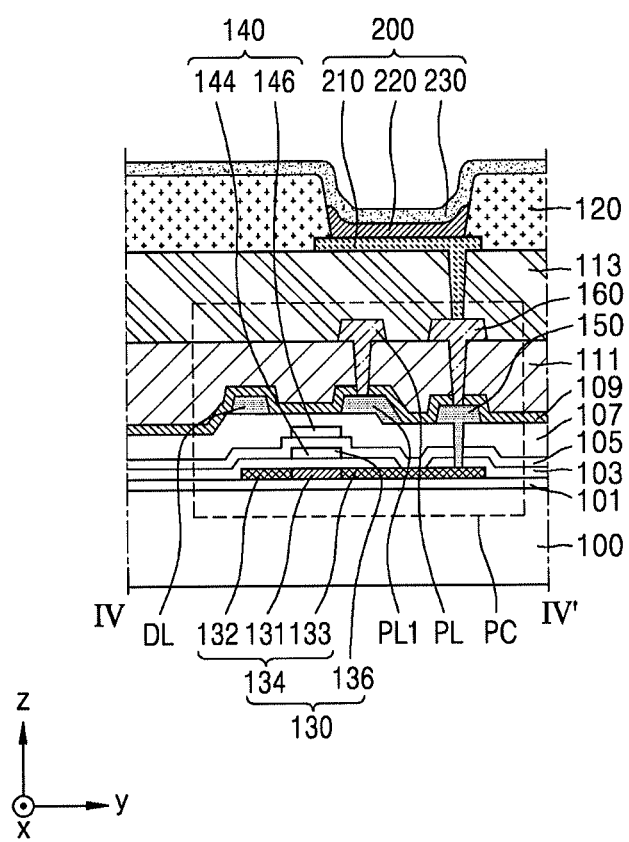
FIG. 4 illustrates a cross-sectional view of a display area of the display apparatus according to an example embodiment.

FIG. 4 is a cross-sectional view of a part of the display apparatus according to an example embodiment. The cross-sectional view shown in FIG. 4 may correspond to a cross-section taken along a line IV-IV' shown in FIG. 1. FIG. 4 illustrates a structure of the pixel P in the display area DA.

Referring to FIGS. 1 and 4, the display apparatus includes the display area DA and the peripheral area PA. The substrate 100 may include an area corresponding to the display area DA and the peripheral area PA. The substrate 100 may be formed of various materials such as glass, metal, or plastic such as polyethylene terephthalate (PET), polyethylene naphthalate (PEN), polyimide, etc.

Referring to the display area DA shown in FIG. 4, a buffer layer 101 may be formed on the substrate 100. The buffer layer 101 may prevent penetration of a foreign substance or moisture through the substrate 100. For example, the buffer layer 101 may include an inorganic material such as silicon oxide (SiOx), silicon nitride (SiNx), and/or silicon oxynitride (SiON), and include a single layer or multiple layers.

A thin-film transistor 130 and a storage capacitor 140 may be located in a position on the substrate 100 corresponding to the display area DA and an organic light-emitting device, which is a display device 200 electrically connected thereto. The thin-film transistor 130 shown in FIG. 4 may correspond to one of the thin-film transistors included in the pixel circuit PC described with reference to FIG. 2, for example, the driving thin-film transistor Td. The storage capacitor 140 shown in FIG. 4 may correspond to the storage capacitor Cst described with reference to FIG. 2.

The thin-film transistor 130 includes a semiconductor layer 134 and a gate electrode 136. The semiconductor layer 134 may include, for example, polysilicon. The semiconductor layer 134 may include a channel area 131 overlapping the gate electrode 136, and a source area 132 and a drain area 133 respectively arranged on opposite sides of the channel area 131 and including a higher concentration impurity than that of the channel area 131. Here, the impurity may include an n-type or p-type impurity. The source area 132 and the drain area 133 may be understood as a source electrode and a drain electrode of the thin-film transistor 130.

In the present example embodiment, a case when the semiconductor layer 134 includes polysilicon is described but, for example, the semiconductor layer 134 may include amorphous silicon, or an organic semiconductor material.

A gate insulating layer 103 may be arranged between the semiconductor layer 134 and the gate electrode 136. The gate insulating layer 103 may be an inorganic insulating layer formed of a material such as SiON, SiOx, and/or SiNx. The inorganic insulating layer may have a single-layered or a multi-layered structure.

The storage capacitor 140 includes first and second storage capacitive plates 144 and 146. A first interlayer insulating layer 105 may be arranged between the first and second storage capacitive plates 144 and 146. The first interlayer insulating layer 105 is a layer having a certain dielectric permittivity. The first interlayer insulating layer 105 may be an inorganic insulating layer formed of a material such as SiON, SiOx. and/or SiNx, and may have a single-layered or a multi-layered structure. FIG. 4 illustrates a case in which the storage capacitor 140 overlaps the thin-film transistor 130 and the first storage capacitive plate 144 is the gate electrode 136 of the thin-film transistor 130 but, for example, the storage capacitor 140 may not overlap the thin-film transistor 130, and the first storage capacitive plate 144 may be a component independent from the gate electrode 136 of the thin-film transistor 130.

The storage capacitor 140 may be covered by a second interlayer insulating layer 107. The second interlayer insulating layer 107 may an inorganic insulating layer formed of a material such as SiON, SiOx, and/or SiNx, and may have a single-layered or a multi-layered structure.

A first conductive layer 150 and a second conductive layer 160 may be arranged above the thin-film transistor 130. The second conductive layer 160 may be arranged on the first conductive layer 150. The first conductive layer 150 may be arranged on the second interlayer insulating layer 107, and the second conductive layer 160 may be arranged on a first organic insulating layer 111. In the present example embodiment, the first conductive layer 150 may be the data line DL and/or a lower driving voltage line PL1 and/or a drain electrode, and the second conductive layer 160 may be a driving voltage line PL and/or a contact wiring.

The driving voltage line PL may be arranged on the first organic insulating layer 111. The driving voltage line PL may include aluminum (Al), copper (Cu), titanium (Ti), or the like, and may be formed to have a single-layered or multi-layered structure. As an embodiment, the driving voltage line PL may be formed to have a multi-layered structure in which Ti. Al, and Ti are stacked.

FIG. 4 shows that a lower-part driving voltage line PL1 is further included below the first organic insulating layer 111. The lower-part driving voltage line PL1 is electrically connected to the driving voltage line PL via a contact hole penetrating into the first organic insulating layer 111 to prevent the driving voltage ELVDD provided through the driving voltage line PL from being dropped. The lower-part driving voltage line PL1 may include a same material as that of the data line DL. For example, the lower-part driving voltage line PL1 and the data line DL may include Al, Cu, Ti or the like, and be formed to have a single-layered or multi-layered structure. As an embodiment, the lower-part driving voltage line PL1 and the data line DL may be formed to have a multi-layered structure in which Ti, Al, and Ti or TiN, Al, Ti are stacked.

The first organic insulating layer 111 includes an organic insulating material. The organic insulating material may include an imide-based polymer, a general commodity polymer such as polymethyl methacrylate (PMMA) or polystyrene (PS), a polymer derivative containing a phenol group, an acrylic-based polymer, an aryl ether-based polymer, an amide-based polymer, a fluorine-based polymer, a p-xylene-based polymer, a vinyl alcohol-based polymer, a combination thereof, or the like. As an embodiment, the first organic insulating layer 111 may include polyimide.

The driving voltage line PL is covered by a second organic insulating layer 113. The second organic insulating layer 113 may include an imide-based polymer, a general polymer such as PMMA or PS, a polymer derivative containing a phenol group, an acrylic-based polymer, an aryl ether-based polymer, an amide-based polymer, a fluorine-based polymer, a p-xylene-based polymer, a vinyl alcohol-based polymer, a combination thereof, or the like. In an embodiment, the second organic insulating layer 113 may include polyimide.

A pixel electrode 210 is arranged on the second organic insulating layer 113. A pixel-defining layer 120 is arranged on the pixel electrode 210. The pixel-defining layer 120 has an opening corresponding to each pixel P, that is, an opening exposing a center portion of the pixel electrode 210 to define the pixels P. Additionally, the pixel-defining layer 120 may increase a distance between an edge of the pixel electrode 210 and a common electrode 230 to prevent an arc or the like from occurring therebetween. The pixel-defining layer 120 may be formed of an organic material such as polyimide or hexamethyldisiloxane (HMDSO).

An intermediate layer 220 may include a polymer material or a low-molecular weight material. If the intermediate layer 220 includes a low-molecular weight material, the intermediate layer 220 may have a single or multiple structure in which a hole injection layer (HIL), a hole transport layer (HTL), an emission layer (EML), an electron transport layer (ETL), or an electron injection layer (EIL) are stacked, and include various organic materials such as a copper phthalocyanine (CuPc), an N,N'-Di (naphthalene-1-yl)-N, N'-diphenyl-benzidine (NPB), a tris-8-hydroxyquinoline aluminum (Alq3) or the like. The layers including the low-molecular weight material may be formed by using a vacuum deposition method.

When the intermediate layer 220 includes a polymer material, the intermediate layer 220 may have a structure including an HTL and an EML. In this case, the HTL may include poly(3,4-ethylene dioxythiophene) (PEDOT), the EML may include a polymer organic material such as poly-phenylenevinylene (PPV) or polyfluorene. In other implementations, a structure of the intermediate layer 220 may have various structures. For example, at least one of the layers included in the intermediate layer 220 may be formed as one body to completely cover the pixel electrodes 210. In another implementation, the intermediate layer 220 may include layers patterned to respectively correspond to a plurality of the pixel electrodes 210.

The common electrode 230 may be arranged above the display area DA to cover the display area DA. Thus, the common electrode 230 may be formed as one body to cover a plurality of the pixels P.

Figure 5:
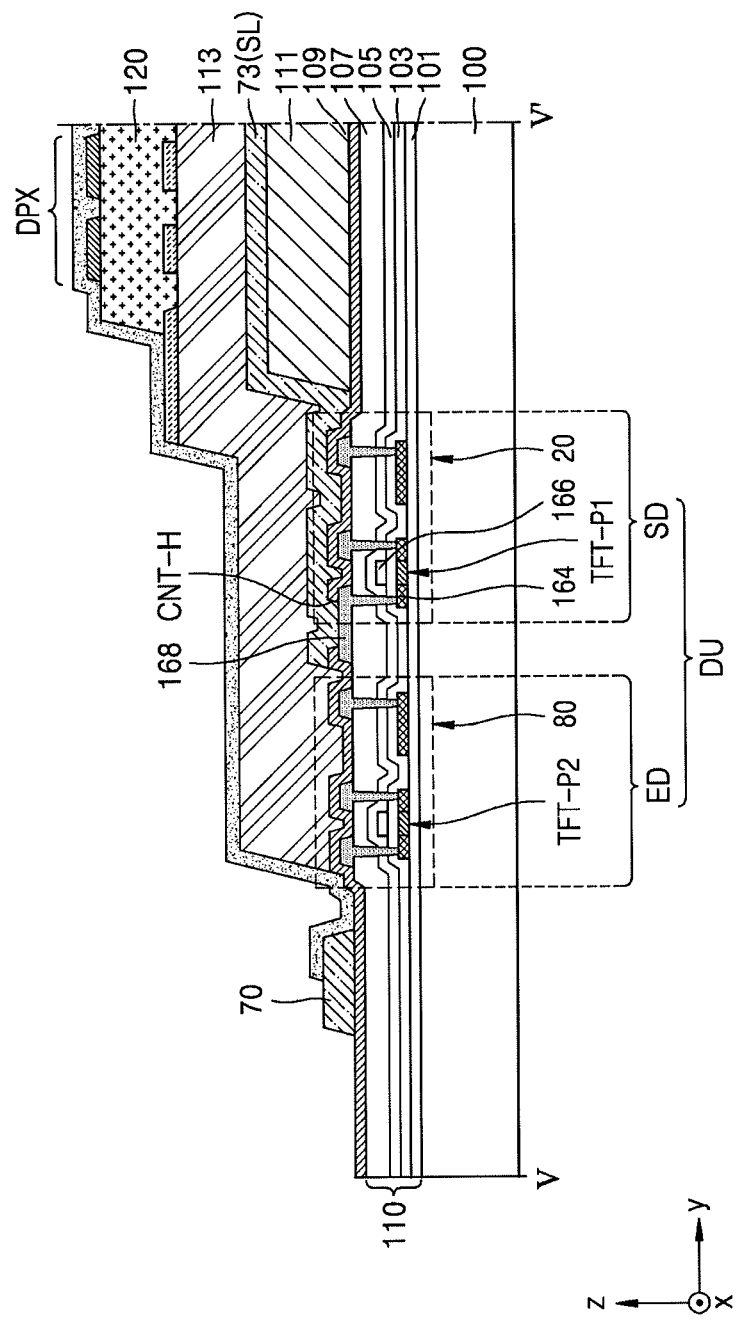
FIG. 5 illustrates a cross-sectional view of the display apparatus according to an example embodiment.

FIG. 5 is a cross-sectional view of a part of the display apparatus according to an example embodiment, corresponding to a cross-section taken along a line V-V' of FIG. 1.

Referring to FIGS. 1, 4 and 5, the driver DU is arranged in the peripheral area PA shown in FIG. 5. The driver DU may include a first driver arranged in a neighboring area outside the display unit 10 and a second driver arranged in a neighboring area outside the first driver. In the present example embodiment, the first driver may be a scan driver SD and the second driver may be a light emission control driver ED. Hereinafter, the "scan driver" is described as the first scan driver 20 and the "light emission control driver" is described as the first light emission control driver 80 as an example.

The driver DU may include driving thin-film transistors TFT-P1 and TFT-P2. Each of the driving thin-film transistors TFT-P1 and TFT-P2 may include a driving semiconductor layer 164, a driving gate electrode 166, and a third conductive layer 168 connected to the driving semiconductor layer 164 via a contact hole. The driving semiconductor layer 164 and the driving gate electrode 166 may be formed of same materials on same layers as those of the semiconductor layer 134 and the gate electrode 136 in the thin-film transistor included in the pixel circuit PC of the display area DA by using a same process. The third conductive layer 168 may be formed of a same material on a same layer as that of the first conductive layer 150 in the pixel circuit PC of the display area DA by using a same process.

The first scan driver 20 is arranged in the peripheral area PA shown in FIG. 5. The first scan driver 20 includes the first driving thin-film transistors TFT-P1. The first driving thin-film transistors TFT-P1 may be connected to an output wiring 73. The output wiring 73 may be, for example, a scan line. The first driving thin-film transistor TFT-P1 may be formed by using a same process as that of the thin-film transistor 130 in the pixel circuit PC. The first scan driver 20 includes an insulating layer between elements constituting the first driving thin-transistors TFT-P1 (e.g., a semiconductor layer, a gate electrode, etc.). For example, at least one of the buffer layer 101, the gate insulating layer 103, and the first and second interlayer insulating layers 105 and 107 may extend to the peripheral area PA to form the insulating layer 110. The insulating layer 110 includes an inorganic insulating material.

In addition, the first light emission control driver 80 is arranged in the peripheral area PA. The first light emission control driver 80 includes the second driving thin-film transistors TFT-P2. The second driving thin-film transistors TFT-P2 may be connected to an output wiring. The output wiring may be, for example, a light emission control line. A composition of the second driving thin-film transistors TFT-P2 may be the same as that of the first driving thin-film transistors TFT-P1 described above.

The first scan driver 20 and the first light emission control driver 80 may be covered by the inorganic insulating layer 109. The inorganic insulating layer 109 may prevent wirings (which may include a metal that may be damaged by an etchant in a process of manufacturing the display apparatus, such as aluminum) from being exposed to an etching environment. FIG. 4 shows that the inorganic insulating layer 109 is also arranged in the display area DA.

The inorganic insulating layer 109 may include an inorganic material such as SiON, SiOx, and/or SiNx. The inorganic insulating layer 109 may have a single-layered or a multi-layered structure. As an embodiment, the inorganic insulating layer 109 may include SiNx. The inorganic insulating layer 109 may have a thickness of, for example, about 500 Å or greater. In another example embodiment, the inorganic insulating layer 109 may have a thickness of 1,000 Å or greater, 1,500 Å or greater, 2,000 Å or greater, 2,500 Å or greater, 3,000 Å or greater, 3,500 Å or greater, 4,000 Å or greater, 4,500 Å or greater, 5,000 Å or greater, 5,500 Å or greater, 6,000 Å or greater, or 6,500 Å or greater. In another implementation, the inorganic insulating layer 109 may have a thickness of 7,000 Å to 10,000 Å.

The common power supply wiring 70 may be arranged to overlap the first scan driver 20 having the inorganic insulating layer 109 therebetween. The common power supply wiring 70 may include a same material as that of the second conductive layer 160, that is, the driving voltage line PL. The first scan driver 20 may be covered by the common power supply wiring 70 to prevent a damage that may be caused by external static electricity.

As described above, the first scan driver 20 may be connected to the output wiring, that is, the scan line SL. One end of the scan line SL may be electrically connected to the pixel circuit PC in the display area DA, and the other end thereof may be electrically connected to the first scan driver 20. In the present example embodiment, the other end of the scan line SL may be arranged to pass over an upper surface of the first scan driver 20 so that at least a part of the scan line SL overlaps the first scan driver 20. Thus, a location in which the scan line SL contacts the first scan driver 20 may be placed between the first scan driver 20 and the first light emission control driver 80.

Thus, a contact point between the scan line SL and the first scan driver 20 may be a portion adjacent to the first light emission control driver. As described above, the inorganic insulating layer 109 is arranged above the driver DU shown in FIG. 5, and the scan line SL may be electrically connected to the first scan driver 20 via a contact hole CNT-H in the inorganic insulating layer 109. At least of a part of the contact hole CNT-H overlaps the other end of the first scan driver 20 and may be located between the first scan driver 20 and the first light emission control driver. As the contact hole CNT-H is located between the first scan driver 20 and the first light emission control driver, the scan line SL may be arranged to pass over an upper surface of the first scan driver 20 and overlap the first scan driver 20.

Thus, a location in which the first scan driver 20 contacts the scan line SL may be moved from a side of the first scan driver 20 to the other side of the first scan driver 20. Thus, an area of the upper surface of the first scan driver 20 may be ensured as a space in which the scan line SL is designed. Thus, a display apparatus having a reduced dead space DS without an increase in the DS may be implemented.

Figure 6:
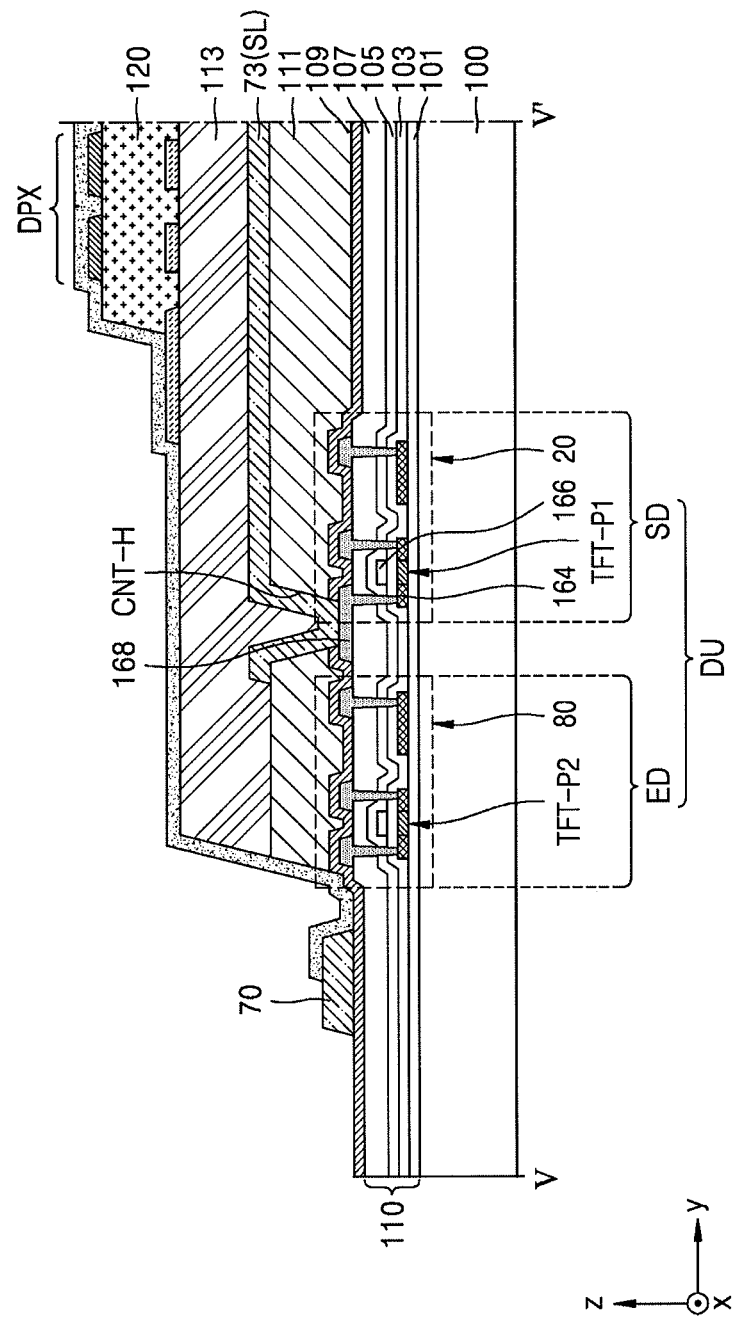
FIG. 6 illustrates a cross-sectional view of the display apparatus according to another example embodiment.

FIG. 6 illustrates a cross-sectional view of the display apparatus according to another example embodiment.

An embodiment described with reference to FIG. 6 is different from the embodiment described with reference to FIG. 5 in a structure of an upper part of a driver. Hereinafter, a difference therebetween is described.

In FIG. 6, the first scan driver 20 and the first light emission control driver 80 may be covered by the inorganic insulating layer 109, the first organic insulating layer 111, and the second organic insulating layer 113. The scan line SL may be between the first organic insulating layer 111 and the second organic insulating layer 113. One end of the scan line SL may be connected to the pixel circuit PC in the display area DA. As shown in FIG. 6, the other end of the scan line SL may be connected to the first scan driver 20.

Like the above-described embodiment, the other end of the scan line SL may be arranged to pass over the upper surface of the first scan driver 20 so that at least of a part of the scan line SL overlaps the first scan driver 20. A location in which the scan line SL contacts the first scan driver 20 may be between the first scan driver 20 and the first light emission control driver. Thus, a contact point between the scan line SL and the first scan driver 20 may be a portion adjacent to the first light emission control driver.

The scan line SL may be connected to the first scan driver 20 via the contact hole CNT-H arranged in the first organic insulating layer 111. The contact hole CNT-H may extend to the inorganic insulating layer 109 arranged below the first organic insulating layer 111. The contact hole CNT-H may be located between the first scan driver 20 and the first light emission control driver. Thus, the scan line SL may be arranged to pass over the upper surface of the first scan driver 20 and overlap the first scan driver 20.

Thus, a location in which the first scan driver 20 contacts the scan line SL may be moved from one side of the first scan driver 20 to the other side of the first scan driver 20. Thus, an area of the upper surface of the first scan driver 20 may be ensured as a space in which the scan line SL is designed, and a display apparatus having a reduced dead space DS without an increase in the DS may be implemented.

By way of summation and review, various types of display apparatuses, such as an organic light-emitting display apparatus, may be used to display an image to a user. As users' needs are becoming increasingly varied, reducing a dead space (the dead space being a space that does not display an image) may be desirable.

As described above, embodiments relate to a display apparatus having a display in which a dead space is reduced while a space for wiring is provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a substrate having a display area and a peripheral area, the peripheral area being outside the display area;
a display unit on the display area of the substrate, the display unit including a pixel circuit and a display device electrically connected to the pixel circuit;
a driver in the peripheral area of the substrate and configured to provide a signal to the display device; and
an output wiring configured to transmit the signal from the driver to the display device, at least a part of the output wiring overlapping the driver, wherein
the driver includes a scan driver configured to provide a scan signal for driving the display device, the scan driver disposed outside the display unit and a light emission control driver disposed outside the scan driver, the output wiring is a scan line, and at least a portion of the scan line overlaps the scan driver so as to pass between at least two driver circuits of the scan driver, and the output wiring passes over the scan driver and has a contact portion connected to the scan driver in a region between the scan driver and the light emission control driver.

2. The display apparatus as claimed in claim 1, wherein:
the driver includes a scan driver, the scan driver being in the peripheral area of the substrate and in a neighboring area outside the display unit, the scan driver being configured to provide a scan signal for driving the display device, and the output wiring includes a scan line, the scan line being configured to transmit the scan signal output from the scan driver to the display device.

3. The display apparatus as claimed in claim 2, wherein the scan line overlaps the scan driver to pass over an upper surface of the scan driver such that the scan driver is interposed between the scan line and the substrate.

4. The display apparatus as claimed in claim 3, wherein the driver includes a light emission control driver in the peripheral area of the substrate and in a neighboring area outside the scan driver, the light emission control driver being configured to provide a light emission control signal for driving the display device.

5. The display apparatus as claimed in claim 4, wherein the scan line does not overlap the light emission control driver.

6. The display apparatus as claimed in claim 4, wherein the scan driver is between the light emission control driver and the display unit.

7. The display apparatus as claimed in claim 1, wherein the display unit has a curved edge in at least a part of an area of the display unit.

8. The display apparatus as claimed in claim 7, wherein the driver is located in the peripheral area adjacent to the part of the area of the display unit, the driver being bent along the curved edge of the area of the display unit.

9. The display apparatus as claimed in claim 1, wherein the display unit has at least one round-shaped edge.

10. The display apparatus as claimed in claim 1, wherein:
the pixel circuit includes a thin-film transistor including a semiconductor layer and a gate electrode of which at least a part overlaps the semiconductor layer, a first conductive layer above the thin-film transistor, and a second conductive layer above the first conductive layer, and the driver includes a driving semiconductor layer on a same layer as that of the semiconductor layer, a driving gate electrode on a same layer as that of the gate electrode, and a third conductive layer on a same layer as that of the first conductive layer.

11. The display apparatus as claimed in claim 10, wherein the output wiring is on a same layer as that of the second conductive layer.

12. The display apparatus as claimed in claim 10, wherein the output wiring is electrically connected to the third conductive layer.

13. The display apparatus as claimed in claim 1, wherein the display device includes a pixel electrode, a common electrode above the pixel electrode, and an organic light emission layer between the pixel electrode and the common electrode.

14. The display apparatus as claimed in claim 13, further comprising a power supply wiring in the peripheral area of the substrate and in a neighboring area outside the driver, the power supply wiring being electrically connected to the common electrode of the display device.

15. The display apparatus as claimed in claim 1, wherein the output wiring overlaps the driver at a position directly over a driving semiconductor layer of an output transistor of the driver.

16. The display apparatus as claimed in claim 1, further comprising one or more insulating layers disposed between the driver and the output wiring such that the output wiring, the one or more insulating layers, and the driver overlap at a position directly over a driving semiconductor layer of an output transistor of the driver.

17. The display apparatus as claimed in claim 16, wherein the one or more insulating layers include an organic insulating layer and an inorganic insulating layer both disposed between the driver and the output wiring such that the output wiring, the organic insulating layer, the inorganic insulating layer, and the driver overlap at a position directly over the driving semiconductor layer of the output transistor of the driver.

18. The display apparatus as claimed in claim 1, wherein an output transistor of the driver is electrically shorted to the output wiring.

19. A display apparatus, comprising:
a substrate having a display area and a peripheral area, the peripheral area being outside the display area;

a display unit on the display area of the substrate, the display unit including a pixel circuit and a display device electrically connected to the pixel circuit;

a first driver in the peripheral area of the substrate and on an outside of the display unit, the first driver being configured to provide a scan signal to the display device;

a second driver in the peripheral area of the substrate and on an outside of the scan driver, the second driver being configured to provide a light emission control signal to the display device;

a first wiring configured to transmit the scan signal from the first driver to the display device, at least a part of the first wiring overlapping the first driver so as to pass between at least two drive circuits of the first driver; and a second wiring configured to transmit the emission control signal from the second driver to the display device, wherein the output wiring passes over the scan driver and has a contact portion connected to the scan driver in a region between the scan driver and the light emission control driver.

20. The display apparatus as claimed in claim 19, wherein the first driver is between the second driver and the display unit.

21. The display apparatus as claimed in claim 19, wherein the display unit has at least one round-shaped edge.

22. The display apparatus as claimed in claim 21, wherein at least of a part of the first driver and at least a part of the second driver are bent along a curve outside the at least one round-shaped edge.

23. The display apparatus as claimed in claim 19, wherein:

the pixel circuit includes a thin-film transistor including a semiconductor layer and a gate electrode of which at least a part overlaps the semiconductor layer, a first conductive layer over the pixel circuit, and a second conductive layer over the first conductive layer, and the first wiring is on a same layer as that of the second conductive layer.

24. The display apparatus as claimed in claim 19, further comprising a power supply wiring in the peripheral area and in a neighboring area outside at least one of the first driver and the second driver, the power supply wiring being configured to supply power to the display device.

25. The display apparatus as claimed in claim 19, wherein the output wiring overlaps the driver at a position directly over a driving semiconductor layer of an output transistor of the driver.

26. The display apparatus as claimed in claim 19, further comprising one or more insulating layers disposed between the driver and the output wiring such that the output wiring, the one or more insulating layers, and the driver overlap at a position directly over a driving semiconductor layer of an output transistor of the driver.

27. The display apparatus as claimed in claim 26, wherein the one or more insulating layers include an organic insulating layer and an inorganic insulating layer both disposed between the driver and the output wiring such that the output wiring, the organic insulating layer, the inorganic insulating layer, and the driver overlap at a position directly over the driving semiconductor layer of the output transistor of the driver.

* * * * *